(12) United States Patent
Bäthis et al.

(10) Patent No.: US 12,063,740 B2
(45) Date of Patent: Aug. 13, 2024

(54) TEMPERATURE MEASUREMENT AND AMBIENT LIGHT MEASUREMENT IN THE CASE OF SELF-LUMINOUS DISPLAY TECHNOLOGIES IN AUTOMOTIVE APPLICATIONS

(71) Applicant: Continental Automotive GmbH, Hannover (DE)

(72) Inventors: Jürgen Bäthis, Braunfels (DE); Markus Weber, Mainz (DE); Torsten Lahr, Zornheim (DE); Rüdiger Lotz, Erzhausen (DE)

(73) Assignee: Continental Automotive GmbH, Hannover (DE)

( * ) Notice: Subject to any disclaimer, the term of this patent is extended or adjusted under 35 U.S.C. 154(b) by 433 days.

(21) Appl. No.: 17/297,700

(22) PCT Filed: Nov. 29, 2019

(86) PCT No.: PCT/EP2019/083107
§ 371 (c)(1),
(2) Date: May 27, 2021

(87) PCT Pub. No.: WO2020/114911
PCT Pub. Date: Jun. 11, 2020

(65) Prior Publication Data
US 2022/0353993 A1 Nov. 3, 2022

(30) Foreign Application Priority Data
Dec. 7, 2018 (DE) ...................... 10 2018 221 239.2
Mar. 21, 2019 (DE) ...................... 10 2019 203 870.0

(51) Int. Cl.
*H01K 1/14* (2006.01)
*H05K 1/14* (2006.01)
(Continued)

(52) U.S. Cl.
CPC ............ *H05K 1/147* (2013.01); *H05K 1/189* (2013.01); *H05K 13/0818* (2018.08); *H05K 2201/10151* (2013.01)

(58) Field of Classification Search
CPC ............ G01K 1/14; G01K 1/16; H05K 1/147; H05K 1/189; H05K 1/14; H05K 1/18;
(Continued)

(56) References Cited

U.S. PATENT DOCUMENTS 6,774,883 B1 8/2004 Mühlemann
9,881,547 B2 1/2018 Eom
(Continued)

FOREIGN PATENT DOCUMENTS

DE 202018106071 U1 12/2018
EP 1467408 A2 10/2004
(Continued)

OTHER PUBLICATIONS

Communication under Rule 71(3) EPC dated Mar. 21, 2023 from corresponding European patent application No. 19813304.3.
(Continued)

*Primary Examiner* — Timothy J Thompson
*Assistant Examiner* — Guillermo J Egoavil

(57) ABSTRACT

A display device with self-luminous display elements, which are arranged in a panel. The panel is provided, on its rear side opposite the light-emitting surface used for display, with a heat distribution element, on the side of which facing away from the rear side at least one temperature sensor is arranged. The heat distribution element has at least one opening, behind which a light sensor is arranged, wherein the light sensor and the temperature sensor are arranged on a common carrier.

6 Claims, 3 Drawing Sheets

(51) Int. Cl.
   *H05K 1/18* (2006.01)
   *H05K 13/08* (2006.01)

(58) Field of Classification Search
   CPC .............. H05K 13/0818; H05K 13/08; H05K 2201/10151; H10K 50/8426; H10K 50/858; H10K 50/865; H10K 59/38; H10K 59/8722; H10K 59/879
   USPC ............................................ 174/254; 257/40
   See application file for complete search history.

(56) References Cited

U.S. PATENT DOCUMENTS

| | | |
|---|---|---|
| 2004/0200953 A1 | 10/2004 | Cok |
| 2005/0248264 A1 | 11/2005 | Cok |
| 2006/0071325 A1* | 4/2006 | Tanaka ................. H01L 23/36 257/E23.101 |
| 2011/0050545 A1 | 3/2011 | Namm et al. |
| 2014/0267202 A1 | 9/2014 | Zheng |
| 2016/0098957 A1 | 4/2016 | Eom |
| 2016/0155384 A1 | 6/2016 | Kim et al. |
| 2017/0176787 A1 | 6/2017 | Jia et al. |
| 2019/0098748 A1* | 3/2019 | Guo ...................... G06F 1/1688 |
| 2020/0081330 A1 | 3/2020 | Chen et al. |
| 2020/0403038 A1* | 12/2020 | Kim ...................... H10K 59/879 |

FOREIGN PATENT DOCUMENTS

| | | | |
|---|---|---|---|
| JP | 2004361735 A | 12/2004 | |
| JP | 2006251601 A | 9/2006 | |
| JP | 2007250276 A | 9/2007 | |
| JP | 2007316243 A | 12/2007 | |
| JP | 2015197372 A * | 11/2015 | ............... G01K 1/14 |
| WO | 2017037850 A1 | 3/2017 | |

OTHER PUBLICATIONS

Search Report dated Oct. 16, 2019 from corresponding German Patent Application No. DE 10 2019 203 870.0.
International Search Report and Written Opinion dated Mar. 3, 2020 from corresponding International Patent Application No. PCT/EP2019/083107.
Decision to Grant a Patent dated Apr. 28, 2022 from corresponding Japanese patent application No. 2021-524980.

* cited by examiner

TEMPERATURE MEASUREMENT AND AMBIENT LIGHT MEASUREMENT IN THE CASE OF SELF-LUMINOUS DISPLAY TECHNOLOGIES IN AUTOMOTIVE APPLICATIONS

CROSS-REFERENCE TO RELATED APPLICATIONS

This U.S. patent application claims the benefit of PCT patent application No. PCT/EP2019/083107 filed Nov. 29, 2019, which claims the benefit of German patent applications No. 10 2018 221 239.2, filed Dec. 7, 2018 and No. 10 2019 203 870.0 filed Mar. 21, 2019, all of which are hereby incorporated by reference.

TECHNICAL FIELD

The present invention relates to temperature and ambient light measurement in technologies for self-luminous displays.

BACKGROUND

Self-luminous displays, for example, organic light-emitting diodes, often abbreviated to OLED, micro-light-emitting diodes, often abbreviated to µLED, quantum dot light-emitting diodes, often abbreviated to QLED, but also other display technologies based on light-emitting diodes or other self-luminous display elements.

A display device with self-luminous display elements, which are arranged on a panel that is provided, on its rear side opposite the light-emitting surface used for display, with a heat distribution element, on the side of which facing away from the rear side at least one temperature sensor is arranged, is known from U.S. Pat. No. 9,881,547 B2. The temperature sensor is in this case permanently built into the panel, in which the self-luminous display elements are also arranged. This is expensive to manufacture and can therefore only be adapted with difficulty to changed requirements in the production process. A solution that is improved compared thereto for temperature measurement, which if possible also includes an ambient light measurement, is desirable.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A heat distribution element has at least one opening, behind which a light sensor is arranged, wherein the light sensor and the temperature sensor are arranged on a common carrier. The arrangement on a common carrier allows the two sensors to be positioned in a defined manner relative to one another. It also allows electrical contact to be made with the sensors. The arrangement of the sensors not in the panel but on the outside of the panel on its rear side makes it possible to use an inexpensive panel that is manufactured without built-in sensors. The sensors, which are to be positioned differently depending on the intended use and the corresponding boundary conditions, are arranged at the respectively appropriate location. The provision of an opening in the heat distribution element is implementable without great effort by either mounting a correspondingly provided heat distribution element to the panel or by removing the corresponding location of a heat distribution element that is already arranged on the panel. The proposed solution is thus inexpensive and yet the corresponding product line is able to be adapted to different circumstances by changing the way in which the temperature sensor or the ambient light sensor is arranged.

A variant makes provision that the common carrier is a flexible printed circuit board. A flexible printed circuit board is thin and therefore permeable to both heat and light. The sensors are arranged on the side of the flexible printed circuit board facing away from the heat distribution element, so that their geometric dimensions/different heights etc. do not negatively affect the heat distribution element, but rather the smooth, unpopulated side of the flexible printed circuit board is in contact with the likewise smooth surface of the heat distribution element.

The flexible printed circuit board has a first contact region and a second contact region, and also a sensor region. The sensor region and the second contact region are embodied here in one piece with the first contact region. However, the sensor region and the second contact region are separated from one another by a recess. In the one embodiment, the recess is a separation produced for example by a mechanical notch. According to another embodiment, the sensor region and the second contact region are located at a greater distance from one another, for example brought about by cutting out a two-dimensional region between the sensor region and the second contact region. This provides a flexible printed circuit board, which is required anyway for bringing the display device into contact with a control unit, so that it is expanded to include temperature and light measurement by attaching a sensor arm/sensor region.

According to another variant, the common carrier is a mechanically stable printed circuit board. A mechanically stable, that is to say inflexible, printed circuit board makes it possible to arrange evaluation electronics or the like directly near the sensors. The stable printed circuit board is arranged at a distance from the heat distribution element. This allows heat to be dissipated through the gap between the stable printed circuit board and the heat distribution element. There is also no thermal or mechanical influence on the heat distribution element by the stable printed circuit board or by components arranged thereon.

The stable printed circuit board is provided with an opening, on the side of which facing away from the heat distribution element the light sensor is arranged. Due to the arrangement of the light sensor on the side facing away from the heat distribution element, the latter is not mechanically affected negatively by the sensors. The opening ensures that the light sensor can receive and detect the light falling through the panel and through the opening in the heat distribution element. When a gap is arranged between the heat distribution element and the stable printed circuit board, there is no restriction of the intermediate space located between them and therefore no impairment either of any heat dissipation caused by drafts or the like.

The printed circuit board is arranged at the heat distribution element by means of a connection element. This saves installation space. Furthermore, it is thus possible to arrange one or more of control electronics for the panel, evaluation electronics for the temperature sensor and/or light sensor, and processing electronics directly at the panel and to pre-assemble and install them as a complete part. For example, an adhesive film on both sides, corresponding adhesive tapes, cured adhesive composition, or some other connection, such as a latching connection or a clamp connection, is provided as the connection element.

If the connection element is a cushion element, vibrations are dampened, different thermal expansions are compensated, and the heat distribution element is protected against direct contact with the printed circuit board. Conversely, the printed circuit board is thus also protected from undesired contact with the heat distribution element, which, if it comes into contact with the surface of the latter, can impair conductor tracks or other elements mounted there. If the cushion element consists of a foamed or porous mass, thermal insulation between the heat distribution element and the printed circuit board is additionally ensured. This reduces the introduction of heat from the printed circuit board to the heat distribution element and thus falsifications of the temperature measurement, and also undesirable heating of the printed circuit board.

The connection element may have at least one recess, which is located in the region of at least one of the sensors, temperature sensor and light sensor. This ensures that the temperature sensor is arranged close to the heat distribution element and/or the light sensor is arranged close to the panel. The respective sensor is shielded against undesired environmental influences in the recess. No stray light that does not come from the panel reaches the light sensor. There is no heat transfer to the temperature sensor that does not come from the panel. According to a variant, air or another suitable fluid is located in the recess as a heat-conducting element.

According to one variant, provision is made for the temperature sensor to be thermally coupled to the heat distribution element by means of a heat-conducting element. For example, a heat-conducting paste arranged between the printed circuit board and the heat distribution element, a heat-conducting paste arranged in a recess in the printed circuit board, thermal passages located in the printed circuit board, or a combination of these or else with other heat-conducting elements known to a person skilled in the art is provided as the heat-conducting element. Therefoe, despite the spaced arrangement of the temperature sensor, possibly on the remote side of the stable printed circuit board, good heat conduction and thus quite a precise measurement of the temperature is nevertheless possible.

A problem area in the case of display devices is the contrast in bright ambient light. A light sensor is typically mounted here next to the display device or its panel. OLED display devices in the consumer sector generally do not require any external temperature sensor. In the automotive sector, however, an additional temperature sensor is necessary because here, due to the high temperatures that may occur and the strong possible temperature fluctuations, a specific algorithm for aging compensation is used, which requires precise temperature sensing. The integration of a sensor on the system side outside of the display region detects the actual temperature only indirectly and imprecisely. Optimal aging compensation cannot take place without precise temperature information. An integration of one or more temperature sensors into the panel 1 is again very complex and inflexible.

A brightness measurement takes place through the active display region of the self-luminous display panel, such as, for example, OLED. The existing optical transmission of the display panel is used for this purpose. The temperature is measured in direct thermal contact with the rear side of the display panel.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

Further advantages and variants of the invention can also be found in the following description of exemplary embodiments on the basis of the figures, in which.

DETAILED DESCRIPTION

Figure 1:
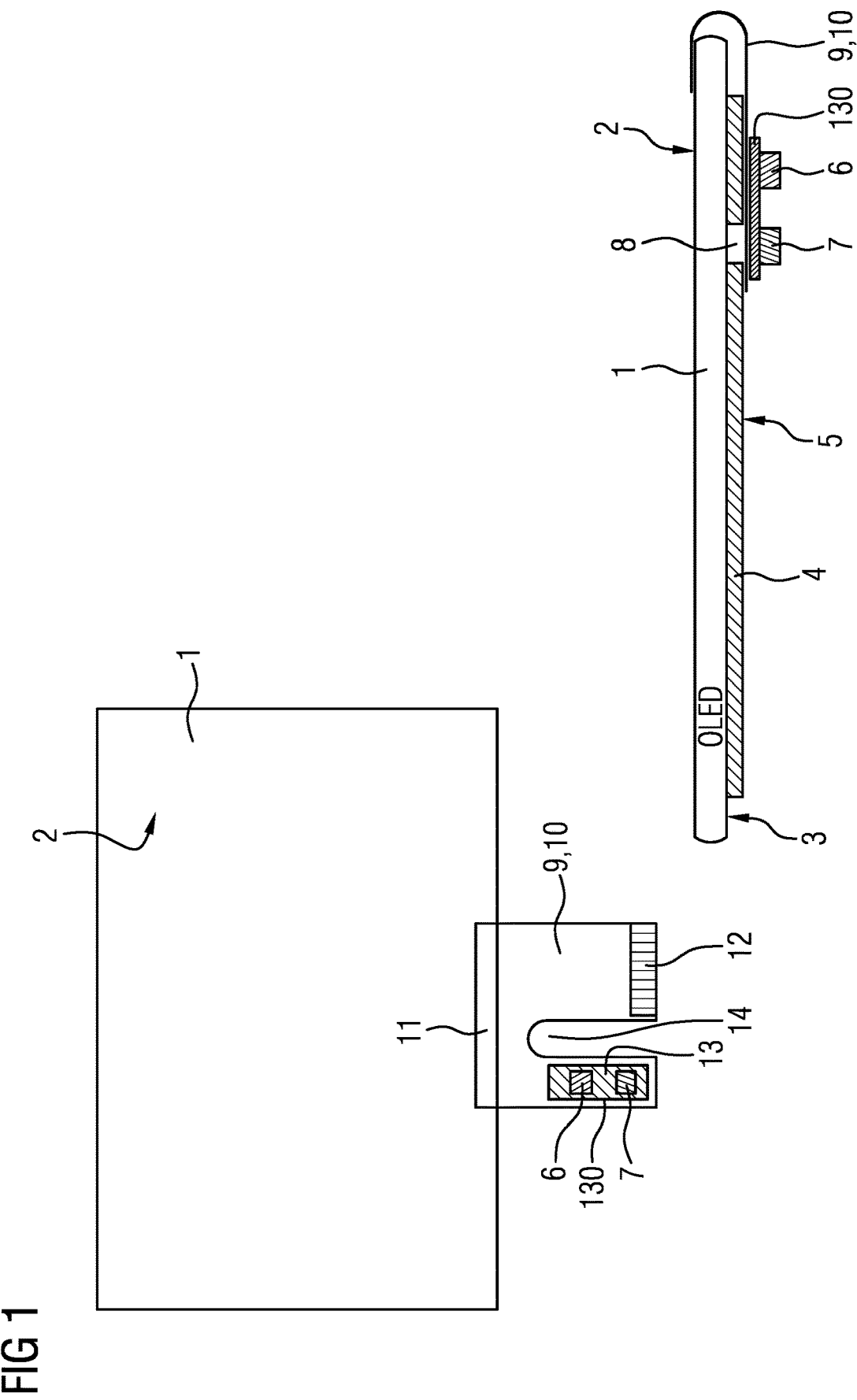
FIG. 1 shows a first embodiment according to the invention.

FIG. 1 shows a plan view and a sectional view of a first embodiment. The panel 1 can be seen, in which the self-luminous display elements, for example organic light-emitting diodes, OLEDs, are arranged. It has a light-emitting surface 2 used for display. A heat distribution element 4 is arranged on the rear side 3 of the panel 1 lying opposite the light-emitting surface 2. A temperature sensor 6 and a light sensor 7 are arranged on the side 5 of the heat distribution element 4 facing away from the rear side 3. The light sensor 7 is often also referred to as a photo sensor. The heat distribution element 4 has an opening 8, behind which the light sensor 7 is arranged. The light sensor 7 and the temperature sensor 6 are arranged on a common carrier 9. In the embodiment illustrated, the common carrier 9 is a flexible printed circuit board 10. The latter has a first contact region 11 and a second contact region 12. The first contact region 11 is used to make contact with the control lines and possibly other electrical lines of the panel 1. Data and supply lines (not shown here) run from the first contact region 11 to the second contact region 12. The flexible printed circuit board 10 furthermore has a sensor region 13, on which the temperature sensor 6 and the light sensor 7 are arranged. The sensor region 13 and the second contact region 12 are embodied in one piece with the first contact region 11 but separated from one another by a recess 14. This can be clearly seen in the plan view on the left-hand side of FIG. 1, in which the flexible printed circuit board 10 is shown in a not yet assembled state. For assembly, the sensor region 13 is bent downward and, as can be seen in the sectional illustration at the bottom right, is placed against the heat distribution element 4 from below. At that time, the light sensor 7 is aligned with the opening 8.

The flexible printed circuit board 10 is provided in the sensor region 13 with a reinforcement element 130, which is shown here hatched in plan view. It serves to reinforce the flexible printed circuit board 10 in the region around the sensors 6, 7. Damage to the flexible printed circuit board 10 is thus prevented. Furthermore, a defined relative alignment of the temperature sensor 6 and the light sensor 7 to one another is ensured. As a result, they are located in one plane. The reinforcement element 130 consists, for example, of a rigid, two-dimensional element mounted to the flexible printed circuit board 10, of a raised print, which may have a stabilizing structure, or the like.

Thus, starting from the panel 1, in addition to the data and supply lines extending over the main part of the flexible printed circuit board 10, a branch extends over a second finger, the sensor region 13, with mounted sensors 6, 7 for temperature and ambient brightness. The line routing on the flexible printed circuit board 10 is designed accordingly such that it is contacted via the main part of the flexible printed circuit board 10 with a system printed circuit board (not illustrated here).

Figure 2:
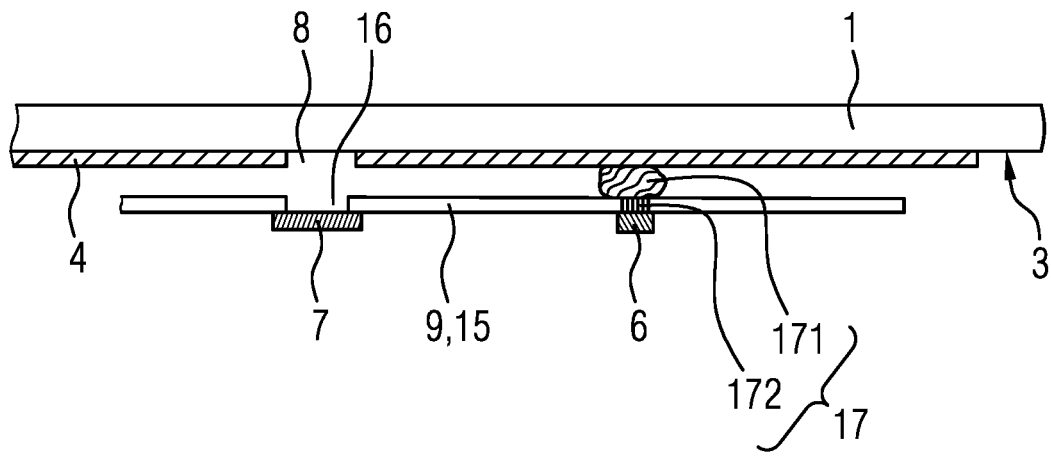
FIG. 2 shows a second embodiment according to the invention.

FIG. 2 shows a second embodiment in a sectional illustration. Elements that are the same or have the same effect are denoted by the same reference signs as described above and are mainly described again if and to the extent that they differ from those described above. This figure shows the panel 1 and the heat distribution element 4, arranged on the rear side 3 thereof, with its opening 8. In this exemplary embodiment, the temperature sensor 6 and the light sensor 7 are arranged on a mechanically stable printed circuit board 15, which acts as a carrier 9. The printed circuit board 15 is, for example, the system printed circuit board. It has an opening 16, on the side of which facing away from the heat distribution element 4 the light sensor 7 is arranged. The temperature sensor 6 is thermally coupled to the heat distribution element 4 by means of two heat-conducting elements 17. A heat-conducting paste 171 is disposed between the heat distribution element 4 and the stable printed circuit board 15, which paste thermally bridges the gap between the printed circuit board 15 and the heat distribution element 4. Furthermore, thermal passages 172 are provided in the printed circuit board 15. The thermal passages 172 consist, for example, of a plurality of adjacent thin holes through the printed circuit board 15, which are provided with a metallic filling. The metallic filling causes good heat conduction. The holes in the printed circuit board are made as standard, like other holes in the printed circuit board, and therefore do not represent an increased effort. The metallic filling is also applied to the printed circuit board like the usual metallic contacting and thus also does not require any increased production outlay.

The printed circuit board 15 is thus mounted directly behind the panel 1 of the OLED display. The two sensors 6, 7 are mounted together with other components (not shown here) on the side facing away from the panel 1. A photosensor, the light-sensitive side of which is aligned toward the opening 16, receives light through the opening 16, which is designed, for example, as a hole in the printed circuit board. The temperature sensor is connected to the panel 1 via thermal passages 172 and heat-conducting material 171. When a plurality of light sensors 7 are mounted, the brightness can also be adapted locally to varying incidence of light occurring, for example, due to shadowing.

Figure 3:
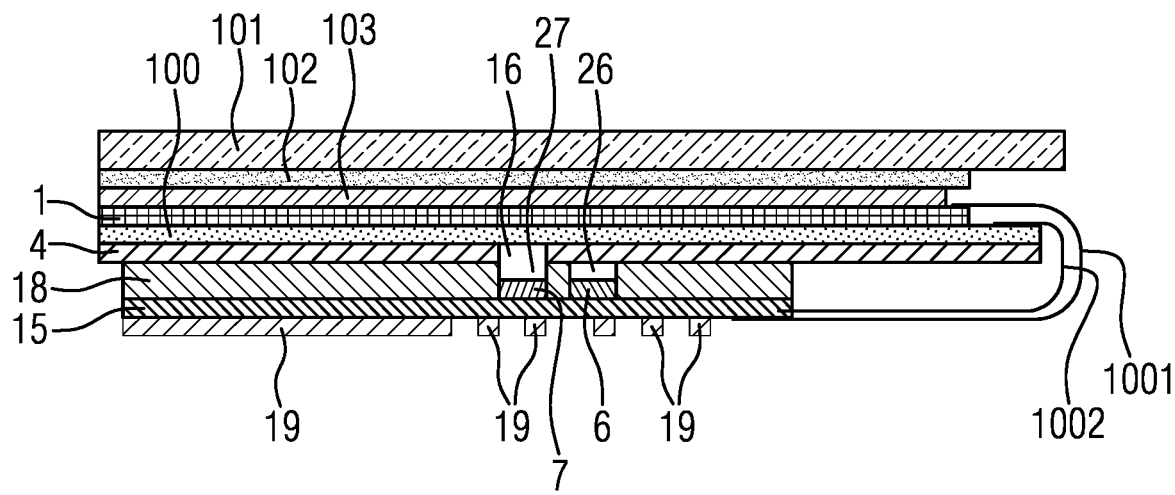
FIGS. 3-5 show further embodiments according to the invention.

FIG. 3 shows a further embodiment, in which a printed circuit board 15 is connected to the heat distribution element 4 by means of a connection element 18. The panel 1 adjoins the heat distribution element 4 and has a field 100 of control elements on its underside, often also referred to as a "low temperature polysilicon" or LTPS layer. Above it, a cover glass 101 is located, which is attached by means of an optically clear adhesive layer 102 to a polarizer 103 that is located on the upper side of the panel 1.

Touch or proximity sensors are located on the panel 1, which are not shown here but are connected to the printed circuit board 15 by means of a flexible printed circuit board 1001. The field 100 of control elements is also connected to the printed circuit board 15 by means of a flexible printed circuit board 1002. On the underside of the printed circuit board 15, electronic elements 19, such as resistors, capacitors, transistors, integrated components and the like, which are not described in more detail here, can be seen. The temperature sensor 6 and the light sensor 7 are arranged on the upper side of the printed circuit board 15. It can be seen that the temperature sensor 6 is located in a recess 26 and the light sensor 7 is located in a recess 27. The recess 27 transitions into the opening 16 of the heat distribution element 4. It is thus possible for stray light, coming from the panel 1, to reach the light sensor 7 without being blocked. The panel transmission in the near infrared range, for example in the range of 800-900 nm, may be detected for this purpose.

Figure 4:
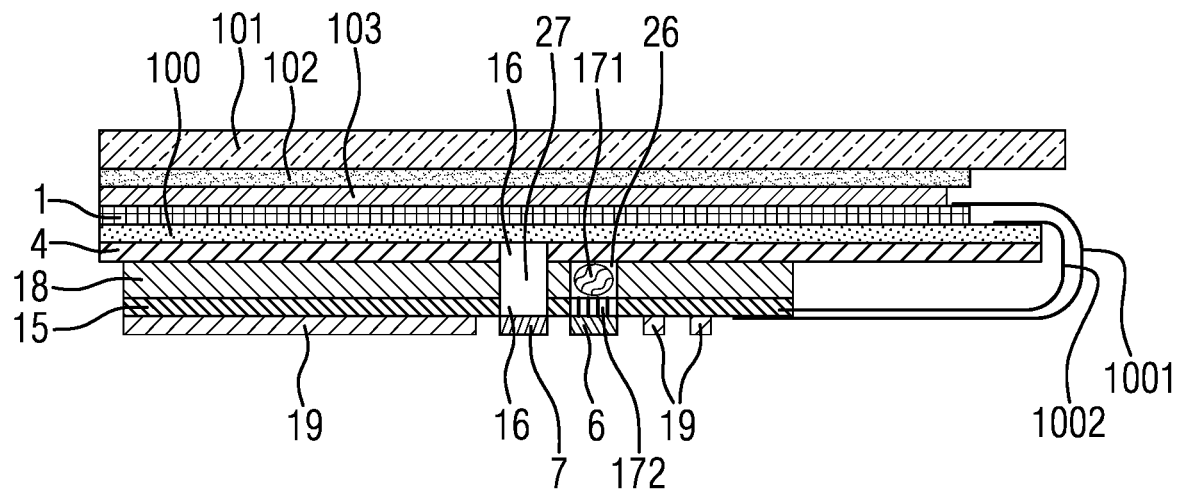

FIG. 4 shows a further variant with a printed circuit board 15 that is fastened to the panel 1 by means of a connection element 18. The same elements as described above are provided with the same reference signs and will not necessarily be described again. It can be seen that the temperature sensor 6 and the light sensor 7 are arranged on the underside of the printed circuit board 15 in this case. For this purpose, the printed circuit board 15 has an opening 16, which adjoins the recess 27 and the opening 16, with the result that the light sensor 7 has visual contact with the panel 1 here as well. The temperature sensor 6 is connected by means of thermal passages 172 to the recess 26, in which a heat-conducting paste 171 is arranged in this case.

Figure 5:
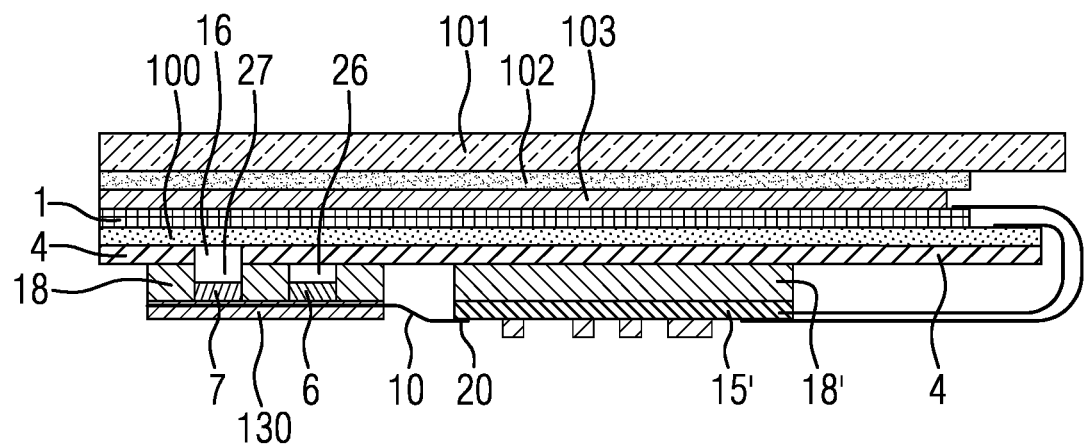

FIG. 5 shows a further embodiment. A printed circuit board 15' is provided here, which contains circuits required for controlling the panel 1. The temperature sensor 6 and the light sensor 7 are arranged on a separate flexible printed circuit board 10, which is provided with a reinforcement element 130. The reinforcement element 130 is shown here on the underside of the flexible printed circuit board 10, but an arrangement on the upper side thereof is also within the scope of the invention. The printed circuit board 15' is connected to the heat distribution element 4 via the connection element 18', while the flexible printed circuit board 10 is connected to the heat distribution element 4 by means of a connection element 18. Here, too, the opening 16 and the recess 27 are again arranged in alignment with the light sensor 7. The temperature sensor 6 is located in a recess 26. The flexible printed circuit board 10 allows for an optimum alignment between the opening 16 and the recess 27 can be achieved without the entire printed circuit board 15' having to be displaced. Only the flexible printed circuit board 10 flexibly connected to it needs to be aligned accordingly. Also, the printed circuit board 15' and the flexible printed circuit board 10 can be designed and produced independently of one another, as a result of which adaptations of the function of the printed circuit board 15' and that of the flexible printed circuit board 10 can be made independently of one another. This increases the flexibility and adaptability to changing circumstances, for example if other or better panels are available that require changed control without changing the sensors, or that require a changed temperature sensor or light sensor without changing the control. According to another variant, the connection element 18 located at the flexible printed circuit board 10 provides a functionality corresponding to the reinforcement element 130. A separate reinforcement element 130 is therefore not necessary.

The embodiments of FIGS. 3-5 have a printed circuit board 15, 15', which is adhered directly to the rear side of the panel 1 by means of a cushioning tape that has adhesive surfaces on both sides. The temperature sensor 6 and the light sensor 7 are either arranged directly on the printed circuit board 15, which contains the circuits required to control the panel 1, or they are arranged at a flexible printed circuit board 10 and connected to the printed circuit board 15 via a separate plug 20. The light sensor 7 thus peeks through the panel 1 and uses the panel transmission which is in the near infrared range in the case of OLEDs. This is sufficient to achieve the desired function. The temperature sensor 6 is either arranged in the direction of the panel 1 on the printed circuit board 15 or is connected to it via thermal passages 172.

The variants proposed have, inter alia: A simple integration of brightness and temperature sensors on the rear side of OLED displays or generally self-luminous displays is made possible. Such displays generate heat, which is dissipated to prevent overheating and premature aging. A precise temperature measurement close to the aging component is possible. Associated therewith, improved aging compensation is also made possible. Optimized contrast in ambient light is also possible. This is also applicable for all displays in mobile applications, such as displays in aviation, displays in trains, displays in medical technology.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the scope of the following claims.

The invention claimed is:

1. A display device comprising:
   a panel composed of self-luminous display elements having a light-emitting surface used for display and an opposing rear side;
   a heat distribution element, on the rear side of the panel;
   at least one temperature sensor located on a side of the heat distribution element facing away from the panel;
   a light sensor, wherein the heat distribution element has at least one opening, behind which the light sensor is arranged; and
   a common carrier, wherein the light sensor and the at least one temperature sensor are arranged on the common carrier, wherein the common carrier is a flexible printed circuit board, and wherein the flexible printed circuit board has a first contact region and a second contact region and a sensor region, wherein the sensor region and the second contact region are embodied in one piece with the first contact region but separated from one another by a recess.

2. A display device comprising:
   a panel composed of self-luminous display elements having a light-emitting surface used for display and an opposing rear side;
   a heat distribution element, on the rear side of the panel;
   at least one temperature sensor located on a side of the heat distribution element facing away from the panel;
   a light sensor, wherein the heat distribution element has at least one opening, behind which the light sensor is arranged; and
   a common carrier, wherein the light sensor and the at least one temperature sensor are arranged on the common carrier, wherein the common carrier is a mechanically stable printed circuit board, and wherein the temperature sensor is thermally coupled to the heat distribution element with a heat-conducting element.

3. A display device as claimed in claim 2, wherein the stable printed circuit board has an opening on the side of which facing away from the heat distribution element the light sensor is arranged.

4. A display device comprising:
   a panel composed of self-luminous display elements having a light-emitting surface used for display and an opposing rear side;
   a heat distribution element, on the rear side of the panel;
   at least one temperature sensor located on a side of the heat distribution element facing away from the panel;
   a light sensor, wherein the heat distribution element has at least one opening, behind which the light sensor is arranged; and
   a common carrier, wherein the light sensor and the at least one temperature sensor are arranged on the common carrier, wherein the common carrier is a printed circuit board, and wherein the printed circuit board is arranged at the heat distribution element with a connection element.

5. The display device as claimed in claim 4, wherein the connection element is a cushion element.

6. The display device as claimed in claim 4, wherein the connection element has at least one recess, which is located in the region of at least one of the temperature sensor and light sensor.

* * * * *